United States Patent
Moore

(10) Patent No.: US 6,767,079 B1
(45) Date of Patent: Jul. 27, 2004

(54) LOW COST HIGH PERFORMANCE THERMAL INK JET PRINTHEAD

(75) Inventor: Steven R. Moore, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 52 days.

(21) Appl. No.: 10/342,724

(22) Filed: Jan. 15, 2003

(51) Int. Cl.⁷ .............................. B41J 2/14; B23P 17/00
(52) U.S. Cl. .......................... 347/49; 347/108; 347/85; 347/63; 29/890.1
(58) Field of Search .............................. 347/59, 43, 63, 347/49, 66, 67, 85; 29/890.1

(56) References Cited

U.S. PATENT DOCUMENTS

| | | |
|---|---|---|
| 3,524,497 A | 8/1970 | Chu et al. |
| 4,532,530 A | 7/1985 | Hawkins |
| 4,579,469 A | 4/1986 | Falcetti |
| 4,601,777 A | 7/1986 | Hawkins et al. |
| 4,638,337 A | 1/1987 | Torpey et al. |
| 4,704,620 A | 11/1987 | Ichihashi et al. |
| 4,774,630 A | 9/1988 | Reisman et al. |
| 4,791,440 A | 12/1988 | Eldridge et al. |
| 4,831,390 A | 5/1989 | Deshpande et al. |
| 4,896,172 A | 1/1990 | Nozawa et al. |
| 5,017,941 A | 5/1991 | Drake |
| 5,257,043 A * | 10/1993 | Kneezel ........................ 347/42 |
| 5,297,336 A * | 3/1994 | Burolla ......................... 347/63 |
| 5,491,364 A * | 2/1996 | Brandenburg et al. ....... 257/786 |
| 5,565,901 A * | 10/1996 | Hawkins ........................ 347/49 |
| 5,665,249 A * | 9/1997 | Burke et al. ................... 347/65 |
| 5,681,757 A * | 10/1997 | Hayes ............................ 437/7 |
| 5,686,224 A | 11/1997 | O'Neill |
| 5,850,234 A * | 12/1998 | Kneezel et al. ................ 347/8 |
| 6,014,153 A * | 1/2000 | Harvey ......................... 347/71 |
| 6,229,114 B1 | 5/2001 | Andrews et al. |
| 6,388,231 B1 * | 5/2002 | Andrews ............... 219/121.69 |
| 6,548,895 B1 * | 4/2003 | Benavides et al. .......... 257/712 |

OTHER PUBLICATIONS

Deborah S. Patterson, *A Comparison of Popular Flip Chip Bumping Technologies,* Flip Chip Technologies, 3701 E. University Drive, Phoenix, AZ 85034.

* cited by examiner

Primary Examiner—Eugene H. Eickholt
(74) Attorney, Agent, or Firm—Fay, Sharpe, Fagan, Minnich & McKee, LLP

(57) ABSTRACT

A printed wiring board 50 is assembled to a molded ink manifold 52. A bonding board 50 has circuit contacts 54 aligned on a similar pitch as circuit contacts 56 on a die module 58. A fluid seal material 64 is applied onto the die mold 58 on an ink inlet surface. During the same dispensing step, a series of microdots of conventional isotropic conductive adhesive 62 are dispensed upon the circuit contacts 56 of the die module 58. The die module 58 is aligned brought into contact with the manifold 52/wiring board 50 assembly. The bonds made by the fluid sealant 64 and the isotropic conductive adhesive 62 are cured simultaneously in an oven.

11 Claims, 10 Drawing Sheets

LOW COST HIGH PERFORMANCE THERMAL INK JET PRINTHEAD

BACKGROUND OF THE INVENTION

The present invention relates to the image rendering arts. It finds particular application in conjunction with thermal ink jet printheads, and will be described with particular reference thereto. However, it is to be appreciated that the present invention is also amenable to other like applications.

Typically, the manufacturing of thermal ink jet printheads involves numerous complicated steps both inside and outside of a clean room. Among the process steps are a plurality of precise adhesive placements and position alignments are performed in the clean room. More specifically, constituent components of the printhead assembly have adhesives applied, are aligned and pressed together, and the adhesives cured in a heater. Typically, each separate component is bonded and cured in a separate step.

More specifically to the prior art, U.S. Pat. No. 6,229,114 to Andrews, et al. describes the construction of a thermal ink jet printhead, and is herein incorporated by reference. First, in the clean room, a die bond epoxy is applied to the bottom side of a die module 1. The die module 1 is then precisely aligned and assembled to a substrate 2, in the case of Andrews, a heat sink. Next, the die bond is cured in an oven for approximately 45 minutes or longer. After the die bond is set, wire bonds 3 are applied between a printed wiring board 4 on said substrate 2 and an electrical contact portion of the die module 1. An adhesion promoter is applied to the top surface of die module 1. A tack fluid seal 5 is precisely located and applied to one surface of the ink manifold assembly 6. The die module 1 and substrate 2 assembly and the manifold 6 an fluid seal 5 assembly are then precisely located to each other and are merged together and a UV adhesive is applied and cured The tack fluid seal is cured in an oven for approximately 45 minutes or longer. An encapsulation adhesive is then injected into the assembly to protect the wire bonds 3 from oxidation. A faceplate 7 is adhered to the operative surface of the printhead.

Once assembled, the printhead is subjected to an additional final cure, along with a series of integrity tests.

U.S. Pat. No. 4,601,777 to Hawkins, et al. describes an alternate method for constructing a thermal ink jet printhead, and is herein incorporated by reference. With reference to FIGS. 2 through 5 of the present application, aspects of existing manufacturing processes are illustrated. In FIG. 2, a daughter board 10 carries a thermal ink jet printhead 12. A portion of daughter board electrodes 14 are carried entirely on the facing side of the daughter board 10, and another portion of the electrodes 14 are carried partially on the reverse side of the daughter board 10, switching sides at inversion points 15. As seen in FIG. 3, daughter board electrodes 14 are connected to individual printhead electrodes 16. The printhead electrodes 16 are carried upon a substrate 18, as best seen in FIGS. 4 and 5. Wire bonds 20 are used to connect between each daughter board electrode 14 and its corresponding printhead electrode 16 counterpart. The wire bonds are installed with a standard wire bonding process as is known in the art.

Each printhead electrode 16 is connected to a heating element 22 (FIG. 5). A plurality of heating elements 22 are situated side by side along a front edge 24 of the substrate 18. An etched manifold 26 is precision aligned with the substrate 18 such that etched grooves 28 in the manifold 26 align precisely with the heating elements 22, defining ink jet channels between the manifold 26 and the substrate 18. Internal pathways and capillaries within the manifold allow ink from a supply aperture 30 to flow into each of the ink jet channels.

The present invention is suited for applications wherein a heat sink substrate is not needed and thermal control of the printhead is accomplished through other means known in the art. The present invention contemplates a new and improved method and apparatus that replaces the wire bonds, and condenses other bonding steps with a single step or process, overcoming the above referenced problems, and others.

BRIEF DESCRIPTION OF THE INVENTION

In accordance with one aspect of the present invention, a method of assembling an ink jet printhead is provided. A printed wiring board is attached to an ink jet manifold. A die module is simultaneously attached to the manifold and the printed wiring board. Adhesives used to bond the die module to the printed wiring board and the manifold are simultaneously cured.

In accordance with another aspect of the present invention, a method of constructing an ink jet cartridge is provided. A fluid seal is dispensed on a first portion of a die module. An isotropic conductive adhesive is dispensed on a second portion of the die module containing a series of bumped electrical contacts. A single component is aligned with the die module, the component including a first, ink jet manifold section and a second, printed wiring board section. The die module and single component are moved into engagement, whereby a fluid seal connection is made, and an electrical connection is made in a single processing step.

In accordance with another aspect of the present invention, a thermal ink jet cartridge is provided. The cartridge includes a manifold and a printed substrate attached to the manifold. A die module single component that includes the manifold and the substrate is attached to at least a printed daughter board, the die module being at least partially attached with a flip chip bumping process.

One advantage of the present invention resides in simplified construction of an ink jet printhead.

Another advantage of the present invention resides in a more robust electrical bond.

Another advantage resides in reduced manufacturing costs.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE INVENTION

Figure 6:
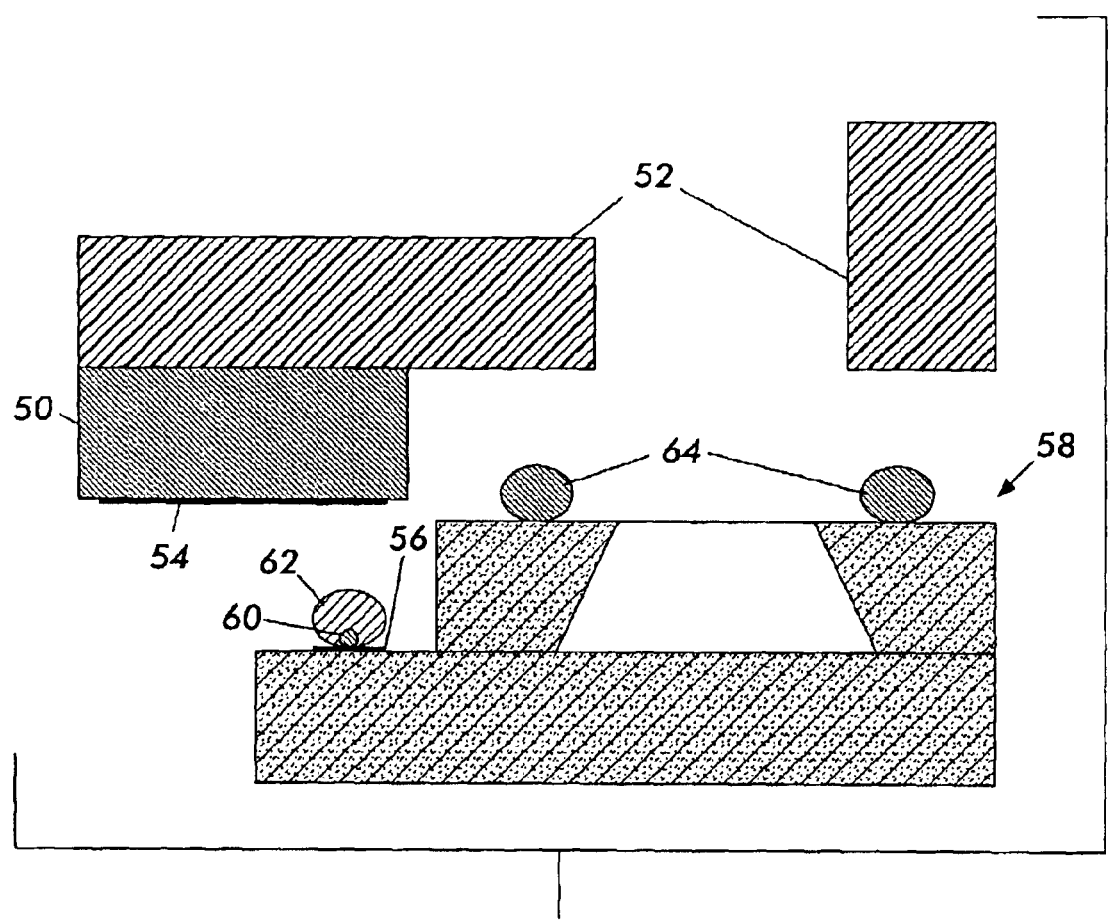
FIG. 6 is a head-on view of a print head and daughter board prior to assembly, in accordance with the present invention.

With reference to FIG. 6, shown is a simplified diagram representing an embodiment for a manufacturing process which implements concepts of the present application. A printed wiring board portion, such as a daughter board 50 is provided with a manifold portion 52 as a single component. A possible board applicable to this embodiment is a single sided punched FR-4 board. The daughter board 50 and the manifold portion 52 are attached using insert molding or staking in this embodiment. It is to be understood that other attachment means are also applicable to the present embodiment. A plurality of daughter board electrodes 54 are printed upon the daughter board portion 50, the electrodes 54 corresponding to counterpart die module electrodes 56 carried on a die module 58. The die module 58 also carries other typical components of a standard ink jet printhead, as are known in the art, including, but not limited to the heating elements, ink channels, an ink reservoir, etc.

The die module 58 is bonded to a component 53, which includes the daughter board portion 50 and manifold portion 52 in a single connection step. It is to be understood that either the die module 58 can be brought into contact with the component 53 or vice versa, that is, the component 53 can be brought into contact with the die module 58. Particularly, a connecting material such as, but not limited to, a gold (Au) bump 60 is applied to each electrode 56 on the die module 58, preferably via an industry standard practice of wafer-level ball bonding. After the gold bumps are applied, an isotropic conductive adhesive (ICA) 62 is applied to each of the bumps 60. In the present embodiment, the ICA 62 is applied in microdots to each of the gold bumps 60 as is typical in a flip chip bonding process. It is to be understood that other adhesives may also be used in other manners within the concepts of the present application. It is also to be understood that the gold bumps 60 and the ICA 62 can be applied to the contacts 54 of the daughter board 50 rather than the contacts 56 of the die module 58.

In the same ICA dispensing step, a fluid seal adhesive 64 is applied to a surface of the die module 58, more specifically, the surface that comes into contact with the manifold portion 52. The fluid seal 64 can be a single component flexible epoxy with a low cure temperature, however, other materials such as silicones and the like are also applicable. It is to be understood that the fluid seal 62 can be applied to the manifold portion 52 instead of the die module, or can be applied to both surfaces. The fluid seal material may be applied as microdots or in any other appropriate manner. The die module undergoes a precision aligning step that precisely aligns the electrodes 54 of the daughter board portion 50 with the electrodes 56 of the die module 58. The die module 58 is then simultaneously brought into contact with both the daughter board portion 50 and the manifold portion 52, connecting the electrodes 54 and 56. The manifold portion 52 can be designed so that it contains a full perimeter capping surface that is partially set back from the die module. Utilizing such a capping surface renders it unnecessary to assemble a separate face plate. Once the daughter board portion 50, the manifold portion 52, and the die module 58 are bonded together, the bonds are simultaneously cured in an oven, as is known in the art. It is to be understood that variances on the curing process are possible, such as local heaters set to different temperatures, local heaters heating for different amounts of time, microwave ovens, and the like.

Figure 7:
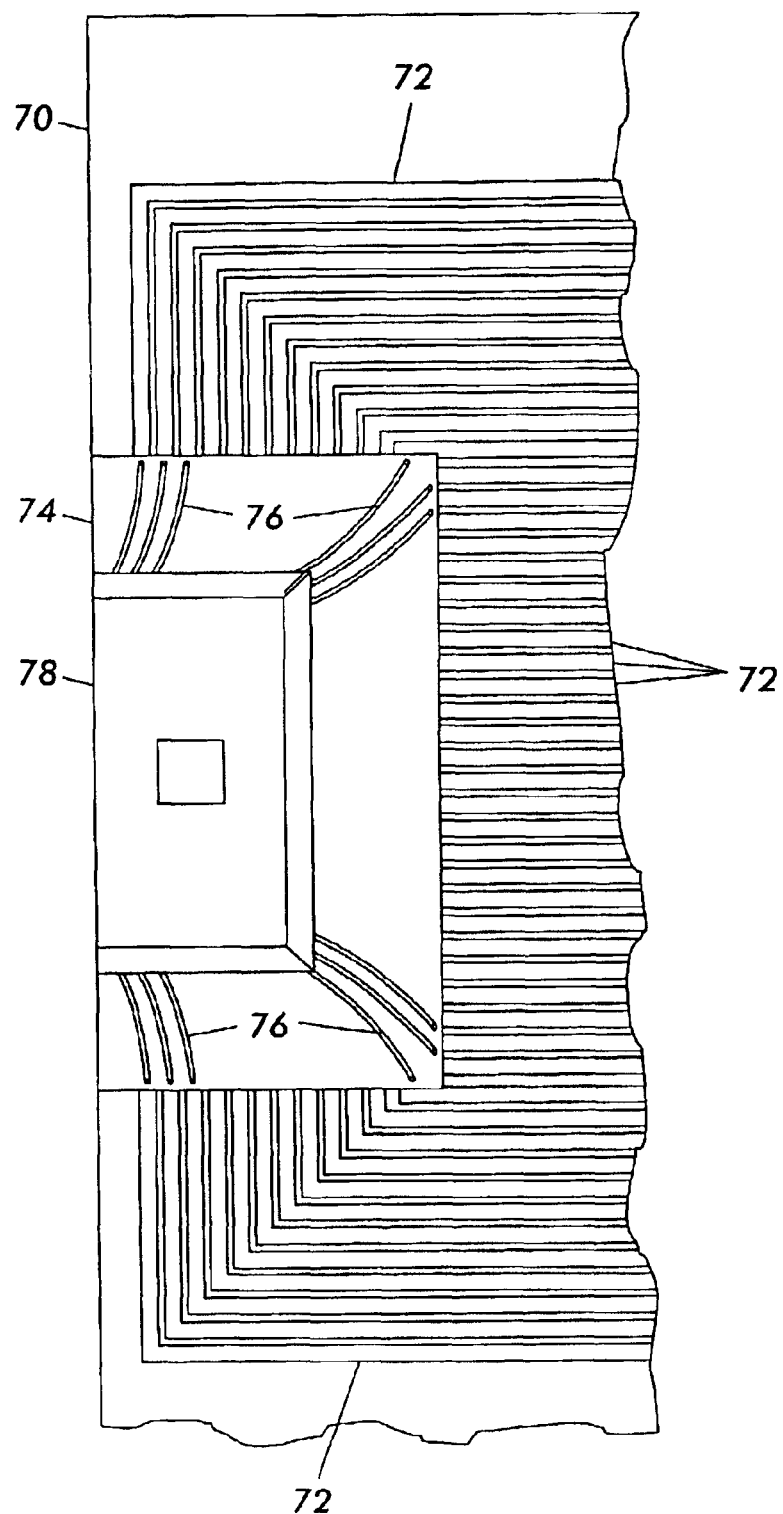
FIG. 7 is a top-down view of a printhead and daughter board in accordance with the present invention.

In another embodiment, with reference to FIG. 7, a daughter board 70 carries a plurality of daughter board electrodes 72 on an upper surface thereof. A printhead substrate 74 carries an additional plurality of substrate electrodes 76, also on an upper surface thereof. An ink jet manifold 78 is bonded to the upper surface of the substrate 74.

Figure 8:
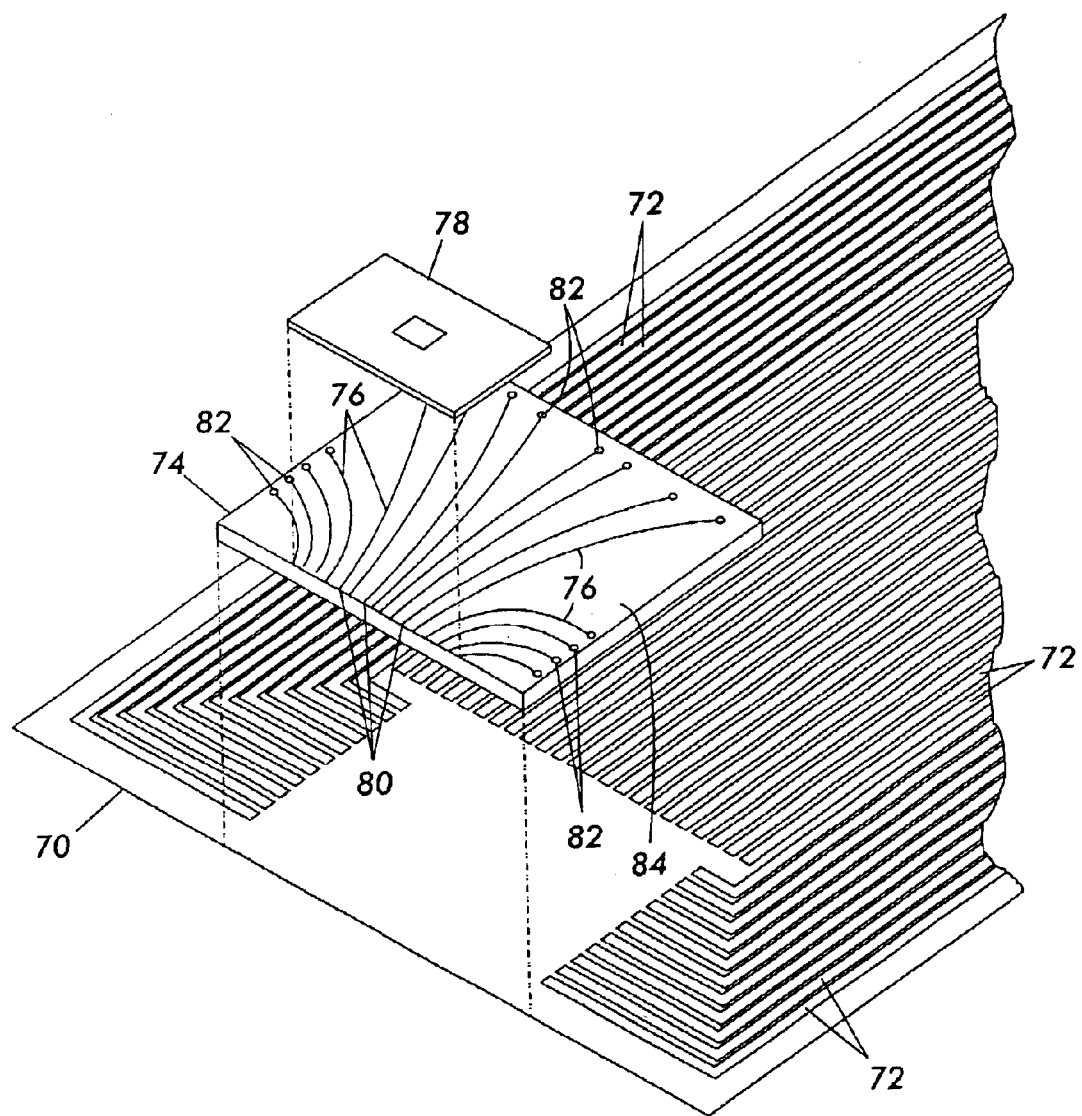
FIG. 8 is an exploded view of the printhead and daughter board of FIG. 7.

With reference to FIG. 8, and with continuing reference to FIG. 7, the manifold 78 is precision aligned with the substrate 74. Grooves in the manifold 78 are aligned precisely with resistive heating elements 80 at the end of each substrate electrode 76 defining ink jet channels when the manifold 78 is bonded to the substrate 74. The substrate electrodes 76 pass through the substrate 74 at inversion points 82. Underside contacts (not shown) provide an electrical connection between the substrate electrodes 76 and the daughter board electrodes 72. The underside contacts are connected to the daughter board electrodes 72 using the solder ball bumping process as previously discussed. The gold bumps and the ICA microdots are applied to the underside contacts. In this application stage, the fluid seal microdots are also applied to an underside of the substrate 74, the underside being opposite an upper side 84 of the substrate 74.

Next, the manifold 78/substrate 74 assembly is aligned with the daughter board 70 such that the underside contacts align with the daughter board electrodes 72. The ICA and the fluid sealant are simultaneously bonded to the daughter board 70. The bonds are cured in an oven as discussed previously.

Figure 1:
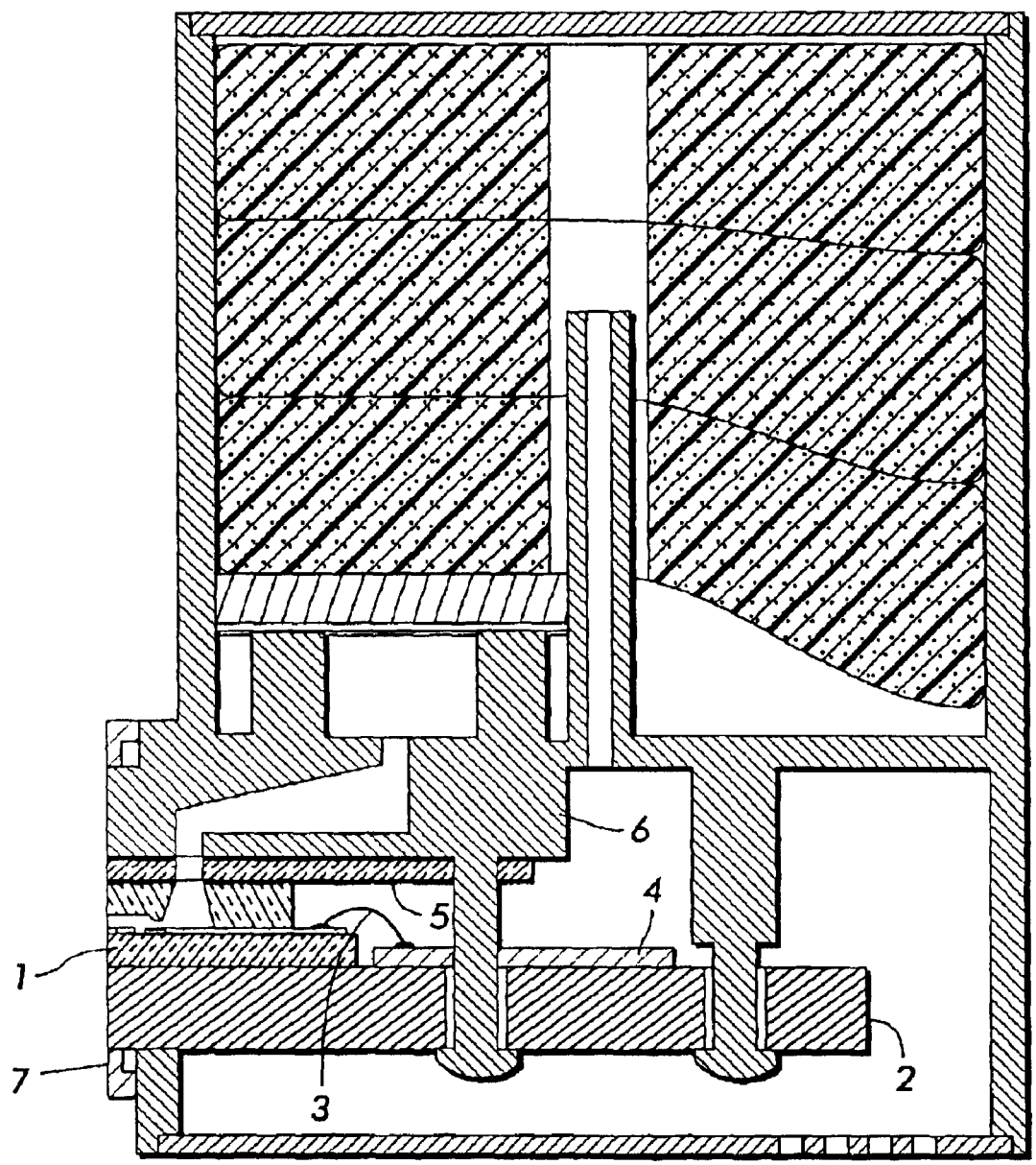
FIG. 1 is a prior art representation of a section view of a typical thermal ink jet printhead.
Figure 2:
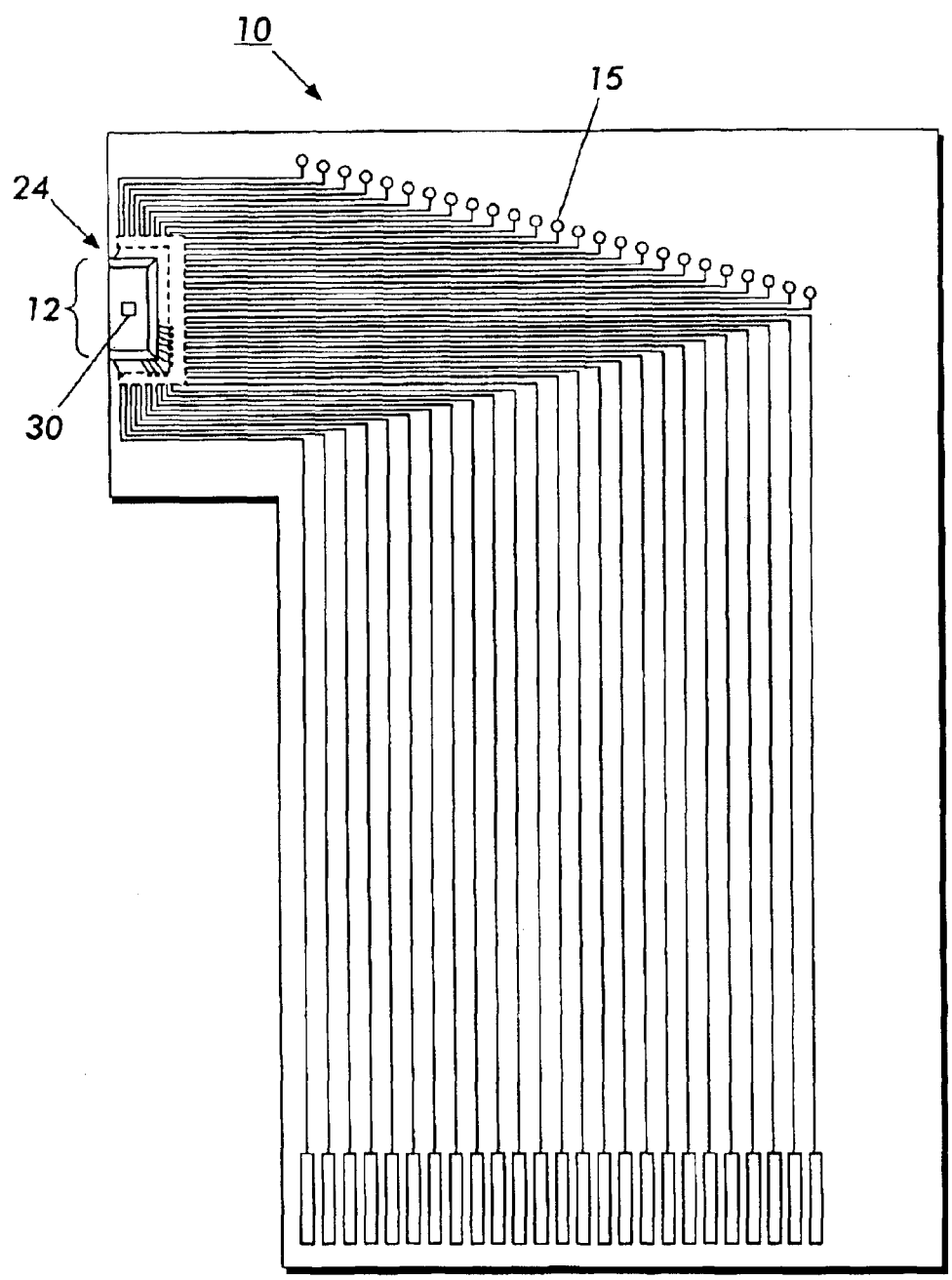
FIG. 2 is a prior art representation of a daughter board with a printhead attached thereupon, in accordance with the present invention.
Figure 3:
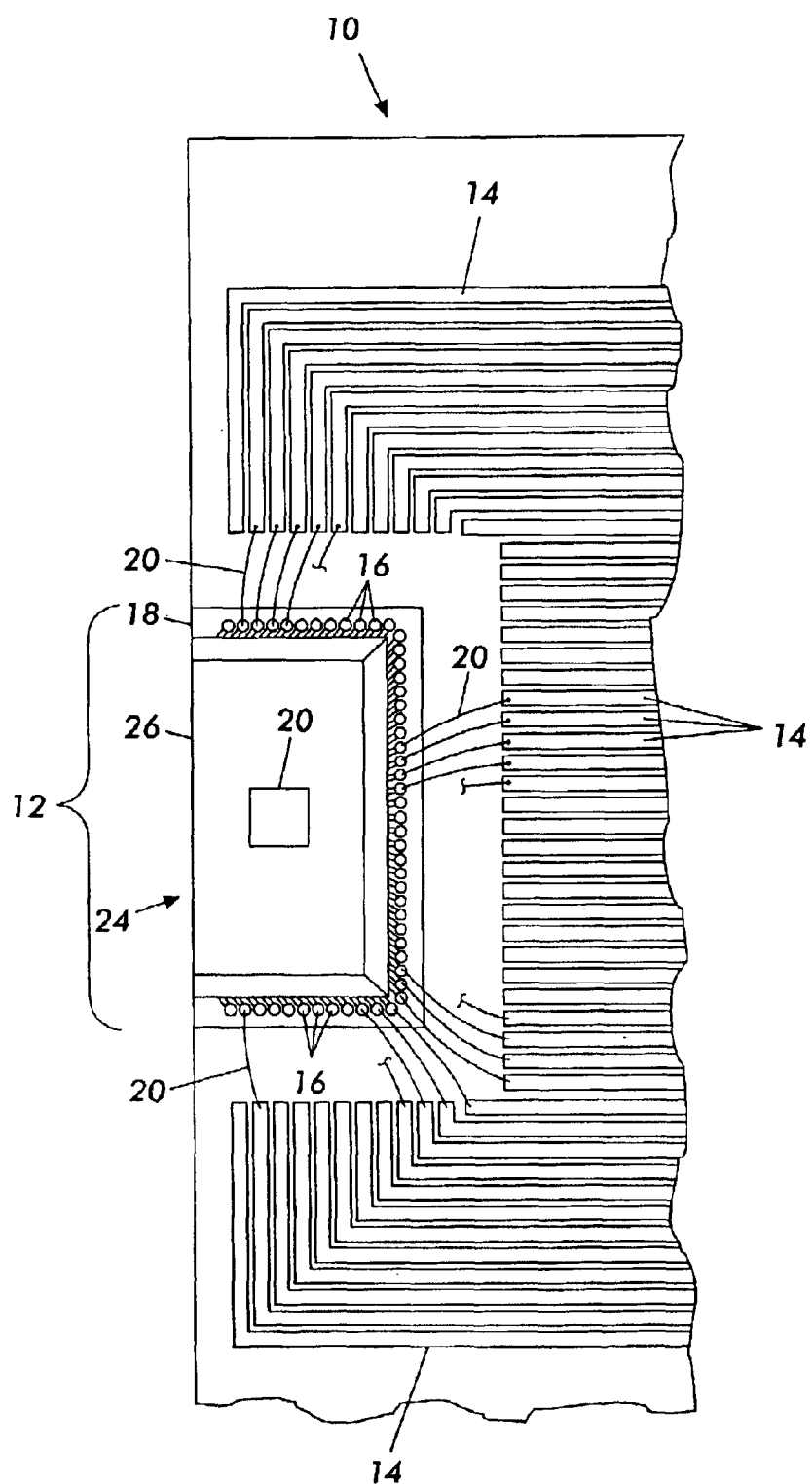
FIG. 3 is a prior art representation of a close up view of an end ofthe daughter board of FIG. 2, with the printhead.
Figure 4:
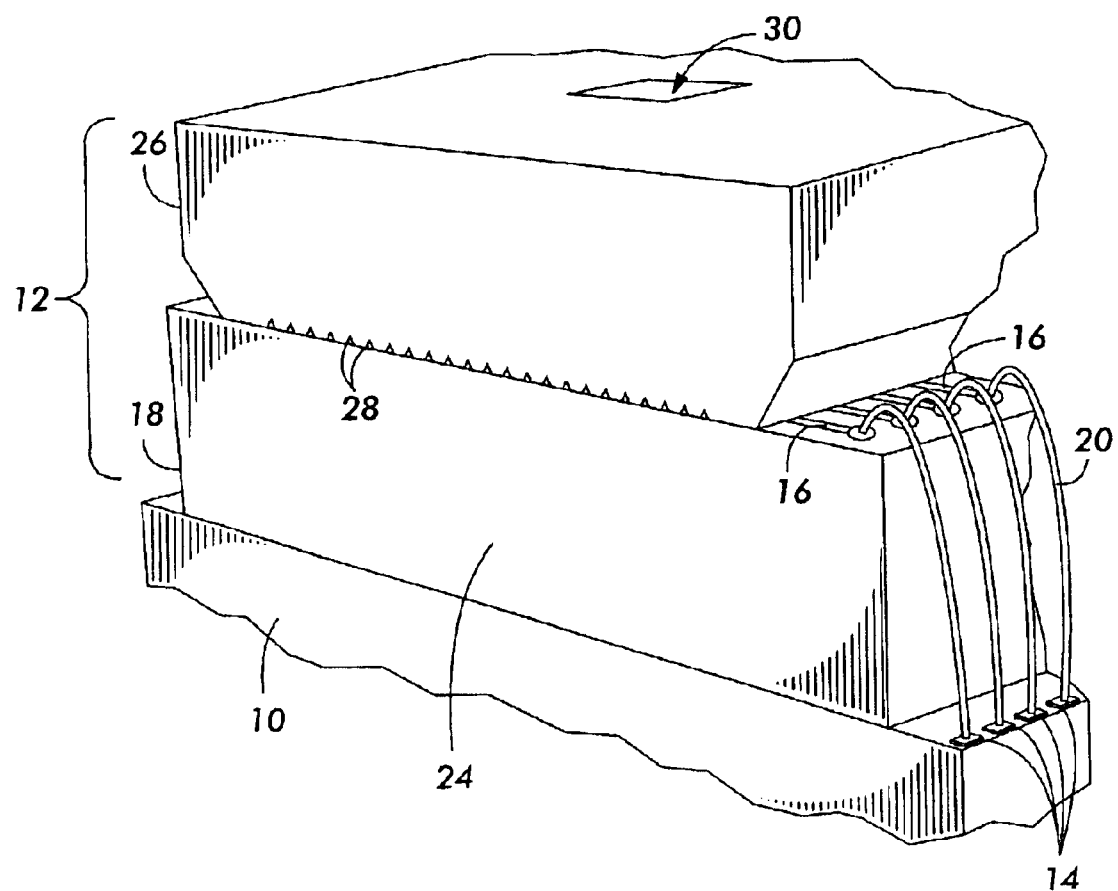
FIG. 4 is a prior art perspective view of the printhead and daughter board of FIGS. 2 and 3.
Figure 5:
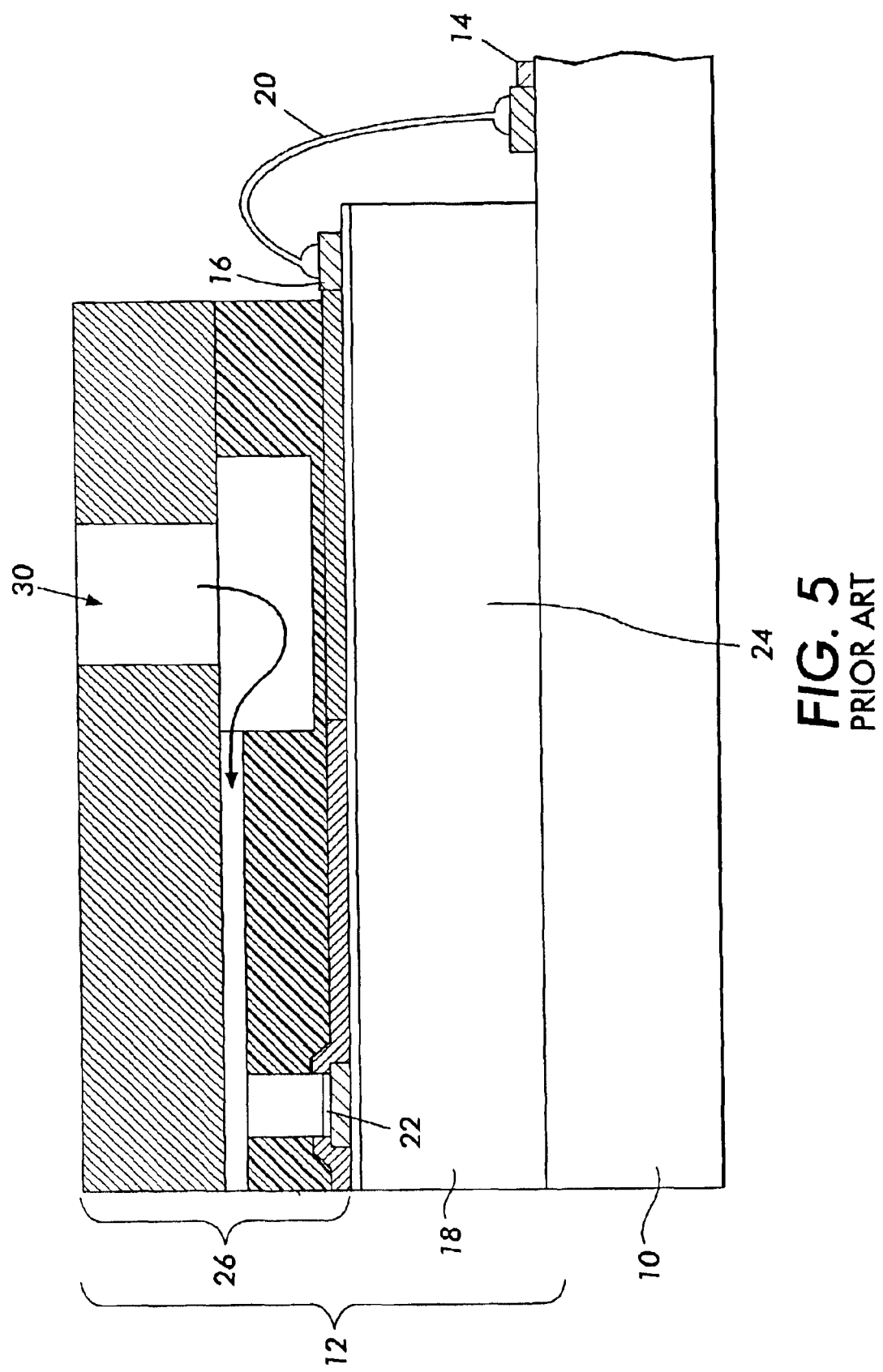
FIG. 5 is a prior art head-on cross-sectional view of the printhead and daughter board of FIGS. 2–4.
Figure 9:
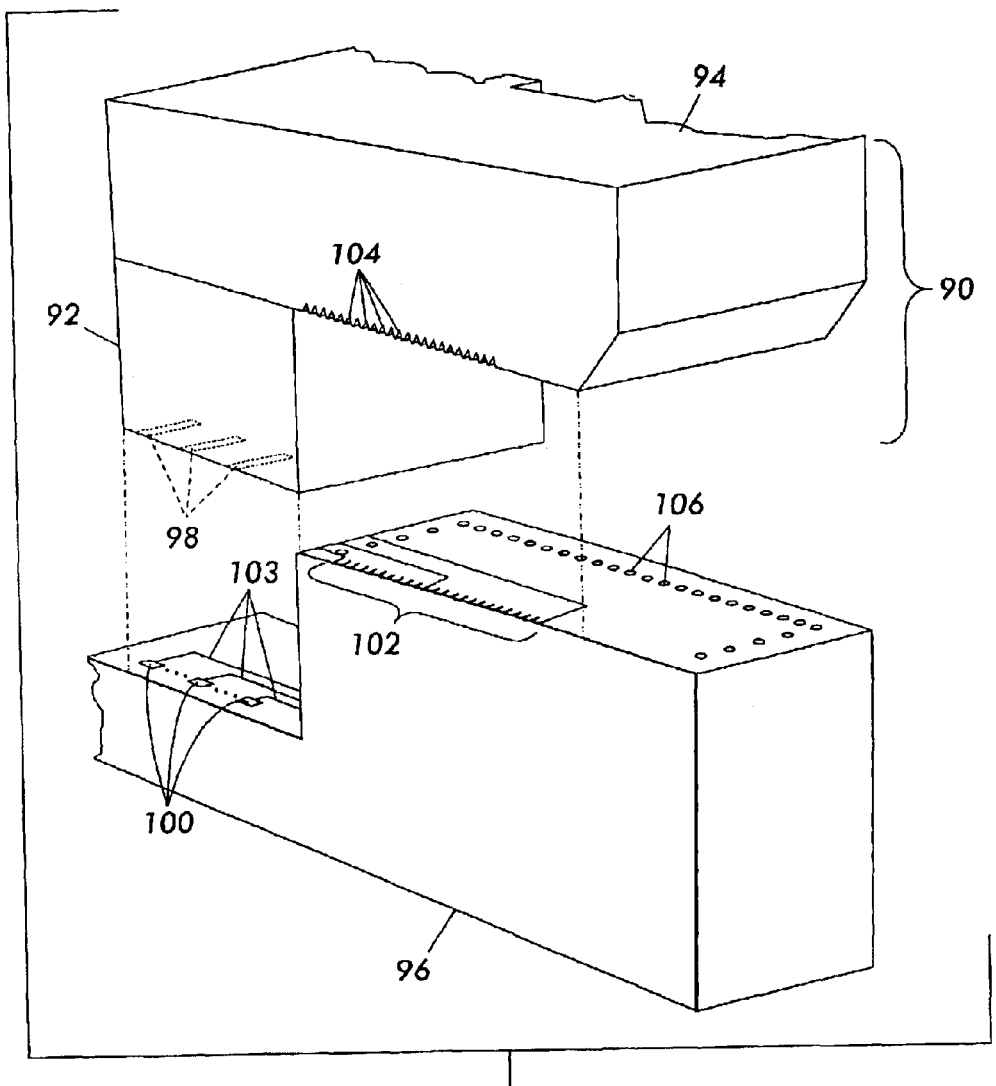
FIG. 9 is a perspective view of a printhead assembly prior to an engagement step, in accordance with the present invention.

In another embodiment, and with reference to FIG. 9, a component 90, which includes a daughter board portion 92 and a manifold portion 94, is bonded to a die module 96. The aforementioned manifold portion 94, daughter board portion 92, and die module 96 can be constructed similarly to the components in FIGS. 4 and 5. The daughter board portion 92 carries a plurality of electrodes 98 that are in electronic communication with the printer. The die module 96 carries electrodes 100 that are in electrical communication with a plurality of heating elements 102 embedded on a surface of the die module 96. Embedded electrical connections 103 are connected between the electrodes 100 and the heating elements. The heating elements 102 are evenly spaced along the surface of the die module 102. Etched into the manifold 94 are a plurality of ink jet channels 104 that are spaced equally to the spacing of the heating elements 102. It is to be understood that he electrodes 98 can be on the same horizontal level as the ink jet channels 104 and the electrodes 100 can be on the same horizontal level as the heating elements 102. The present embodiment staggers the levels of these components to simplify an alignment process.

Microdots of fluid seal adhesive 106 are applied to the surface of the die module 96 that carries the heating elements 102. In the same dispensing step, microdots of ICA are applied to the die module electrodes 100, which were previously prepared for a solder bumping process, as described previously. It is to be understood that the fluid seal 106 and the ICA can be applied as set forth previously, or applied to the facing surfaces of the component 90, or a combination of both.

Figure 10:
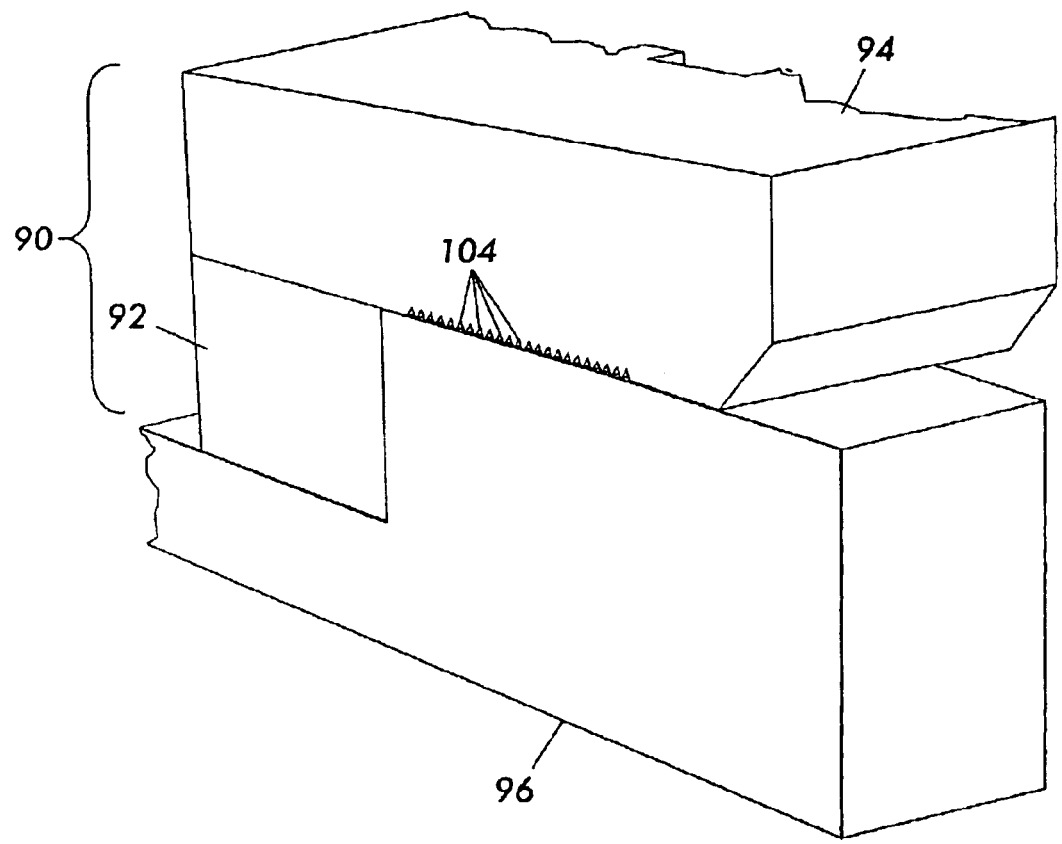
FIG. 10 is an engaged view of the assembly of FIG. 9.

A single precision alignment is performed. In this step, the electrodes 98, 100 are aligned and the heating elements 102 and the ink jet channels 104 are aligned. The component 90 is brought into physical contact with the die module 96, as shown in FIG. 10 creating a bond therebetween. Alternately, the die module 96 can be moved to contact the component 90. The electrodes 98, 100 are brought into electrical contact, and each ink jet channel 104 is positioned directly atop a heating element 102. The ICA and fluid seal bonds are then cured in an oven.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method of assembling an ink jet printhead assembly comprising:
    attaching a printed wiring board to an ink jet manifold;
    attaching a die module simultaneously to the manifold and the printed wiring board;
    simultaneously curing a plurality of adhesives used to bond the die module to the manifold and the printed wiring board.

2. The method as set forth in claim 1, wherein the step of attaching includes:
    dispensing a fluid seal about an ink inlet on the die module at junctures where the die module abuts the manifold;
    dispensing an isotropic conductive adhesive on electrical contacts of the die module, at a juncture where the die module abuts the printed wiring board.

3. The method as set forth in claim 2, wherein the dispensing steps include applying microdots of adhesive to bumped contact surfaces of the die module.

4. The method as set forth in claim 2, wherein the step of curing includes curing the adhesives in an oven at a temperature of 100° C. or greater.

5. A method of constructing an ink jet cartridge comprising:
    dispensing a fluid seal on a first portion of a die module;
    dispensing an isotropic conductive adhesive on a second portion of the die module;
    aligning a single component having a first, ink jet manifold section, and a second printed wiring board section with the die module;
    moving the die module and single component into engagement, whereby a fluid seal connection is made, and an electrical connection is made in a single processing step;
    simultaneously curing the fluid seal connection and the electrical connection.

6. The method as set forth in claim 5, wherein the step of dispensing an isotropic conductive adhesive includes dispensing a plurality of portions of isotropic conductive adhesive at a plurality of circuit contacts.

7. A thermal ink jet cartridge comprising:
    a manifold;
    a printed substrate attached to the manifold;
    a die module single component that includes the manifold and the substrate attached to at least a printed daughter board, the die module being at least partially attached with a flip chip solder bumping process.

8. The thermal ink jet cartridge as set forth in claim 7, further including:
    a fluid seal adhesive that bonds the die module to the printed daughter board.

9. The thermal ink jet cartridge as set forth in claim 8, further including:
    an isotropic conductive adhesive that secures electrical contacts of the substrate to matching electrical contacts of the daughter board.

10. The thermal ink jet cartridge as set forth in claim 9, wherein the adhesives used to attach the die module to the daughter board are bonded simultaneously.

11. The thermal ink jet cartridge as set forth in claim 10, wherein the bonds are cured simultaneously.

* * * * *